(12) United States Patent
Bakker et al.

(10) Patent No.: US 7,211,810 B2
(45) Date of Patent: May 1, 2007

(54) METHOD FOR THE PROTECTION OF AN OPTICAL ELEMENT, LITHOGRAPHIC APPARATUS, AND DEVICE MANUFACTURING METHOD

(75) Inventors: Levinus Pieter Bakker, Helmond (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 19 days.

(21) Appl. No.: 11/024,011

(22) Filed: Dec. 29, 2004

(65) Prior Publication Data
US 2006/0138354 A1 Jun. 29, 2006

(51) Int. Cl.
*H01J 37/08* (2006.01)

(52) U.S. Cl. ................. 250/492.1; 250/492.1

(58) Field of Classification Search ........... 250/492.1, 250/492.21; 362/268
See application file for complete search history.

(56) References Cited

U.S. PATENT DOCUMENTS

| | | |
|---|---|---|
| 6,359,969 B1 | 3/2002 | Shmaenok |
| 6,576,912 B2 | 6/2003 | Visser et al. |
| 2006/0072084 A1* | 4/2006 | Van Herpen et al. ......... 355/30 |

* cited by examiner

*Primary Examiner*—Nikita Wells
*Assistant Examiner*—James J. Leybourne
(74) *Attorney, Agent, or Firm*—Pillsbury Winthrop Shaw Pittman LLP

(57) ABSTRACT

A method for the protection of an optical element of a lithographic apparatus including the optical element and a source of radiation includes providing a material including one or more elements selected from B, C, Si, Ge and/or Sn, and arranging the material such that the source, in use, causes removal of at least part of the material, thereby providing depositable material, and such that at least part of the depositable material deposits on the optical element.

32 Claims, 4 Drawing Sheets

METHOD FOR THE PROTECTION OF AN OPTICAL ELEMENT, LITHOGRAPHIC APPARATUS, AND DEVICE MANUFACTURING METHOD

BACKGROUND OF THE INVENTION

1. Field of the Invention

The present invention relates to a method for the protection of an optical element, a device manufacturing method, and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multi-layer mirrors, with fragile surfaces. This surface is gradually degraded due to the impact, or sputtering, of the particles expelled from the plasma and the lifetime of the mirrors is thus decreased. The sputtering effect is particularly problematic for the collector mirror. The purpose of this mirror is to collect radiation which is emitted in all directions by the plasma source and direct it towards other mirrors in the illumination system. The collector mirror is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In order to prevent the damage of the collector mirror by debris particles, gas barriers have been presented, for example as described in U.S. Pat. Nos. 6,576,912 and 6,359,969. A disadvantage of such gas barriers is that the fast particles not only pass through channels of the barrier structure, but part of the particles collide with the gas barrier thereby providing secondary particles that may deposit on the optical elements. This deposition may damage the optical elements and reduce their optical properties. Further, such deposition is usually difficult to remove. Hence, an alternative method is therefore required to address this problem.

SUMMARY OF THE INVENTION

It is an aspect of the present invention to provide a method for the protection of an optical element. It is further an aspect of the present invention to provide a device manufacturing method. It is yet a further aspect of the invention to provide a lithographic apparatus.

According to a first embodiment of the present invention, a method for the protection of an optical element of a lithographic apparatus comprising the optical element and a source of radiation, includes providing a material comprising one or more elements selected from B, C, Si, Ge and/or Sn; and arranging the material such that the source of radiation, in use, causes removal of at least part of the material, thereby providing depositable material, and such that at least part of the depositable material deposits on the optical element.

According to another embodiment of the present invention, a method for the protection of an optical element for a lithographic apparatus including a source of radiation, one or more parts selected from a gas barrier, a support, an apparatus wall, a wall of a chamber of the source of radiation, and an edge of an aperture; the source of radiation, in use, providing a plasma comprising Sn, the method includes a) providing the plasma comprising Sn, thereby providing a Sn deposition on the one or more parts; b) providing the optical element to the apparatus; and c) providing the plasma comprising Sn, thereby providing a Sn deposition to the optical element.

According to yet another embodiment of the present invention, a device manufacturing method includes providing a lithographic apparatus comprising an optical element and a source of radiatin; providing a radiation beam from radiation generated by the source of radiation; patterning the radiation beam; projecting the patterned radiation beam onto a target portion of a substrate; providing a material comprising one or more elements selected from B, C, Si, Ge and/or Sn; and arranging the material such that the source, in use, causes removal of at least part of the material, thereby providing depositable material, and such that at least part of the depositable material deposits on the optical element According to yet another embodiment of the present invention, a lithographic apparatus includes an illumination system configured to condition a radiation beam; a support configured to support a patterning device, the patterning device configured to impart the radiation beam with a pattern in its cross-section to form a patterned radiation beam; a substrate table configured to hold a substrate; a projection system configured to project the patterned radiation beam onto a target portion of the substrate; an optical element; a source of radiation; one or more parts of the lithographic apparatus, comprising a gas barrier, the support, an apparatus wall, a wall of a chamber of the source of radiation, an electrode, and an edge of an aperture, having a deposition comprising one or more elements selected from B, C, Si, Ge and/or Sn, wherein the deposition has a layer thickness of 5–200 μm.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
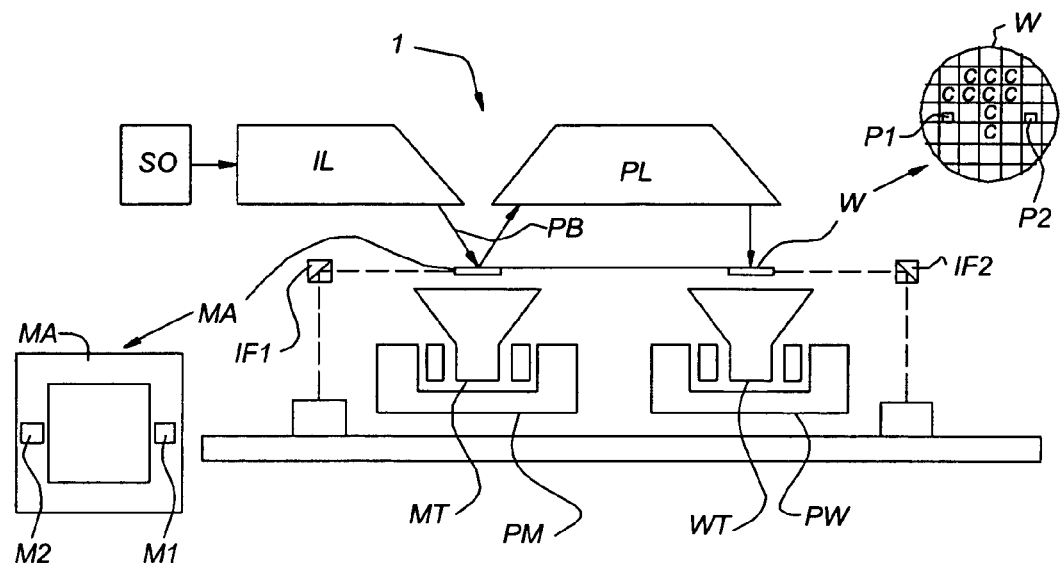
FIG. 1 depicts a lithographic apparatus according to an embodiment of the present invention.

In an embodiment of the present invention, the material is provided to at least part of a gas barrier positioned in a lithographic apparatus. In another embodiment, there is provided a method wherein the material is provided to at least part of a support, an apparatus wall, a wall of a chamber of a source of radiation, and/or an edge of an aperture positioned in the lithographic apparatus. In yet a further embodiment, there is provided a method wherein the material is provided to at least part of one or more electrodes of the source of radiation.

In an embodiment, the source of radiation is a plasma source including a Xe source of radiation, a Li source of radiation, or a Sn source of radiation. Such sources, but also other known sources, provide, in addition to radiation, particles, for example ions, electrons, clusters, particles, droplets, electrode erosion, etc. In yet a further embodiment, the source is a laser-produced plasma or a discharge source. In a further embodiment, at least part of the material is removed from parts of the lithographic apparatus, for example a support, a heat shield, an apparatus wall, a wall of a chamber of a source of radiation, an edge of an aperture, a gas barrier, etc. by particles from the source of radiation, and wherein the particles have an energy in the range between about 0.1 keV and 10 keV, e.g. of 1 keV or more.

The particles from the source impinge on surfaces of parts of the lithographic apparatus, thereby providing other particles (i.e. secondary particles). However, when impinging on the material of the present invention, depositable material (also secondary particles) is provided that may deposit on the optical element, instead of prior art methods wherein due to the impinging of the particles on the parts of the lithographic apparatus, secondary particles such as Fe, Al, Cu, Mo, W, Ni, and/or Ti, depending on which type of materials are used in the lithographic apparatus, are released which deposit on the optical element and which are not easily removed from the optical element. Hence, in yet a further embodiment, at least part of the material, provided to one or more parts of the apparatus, is removed by one or more methods including collision of particles from the source of radiation with the material, irradiation of the material (e.g. comparable or similar to laser ablation) and/or transfer of thermal energy to the material. In this way, removal of at least part of the material is effected during use of the apparatus. For example, when Sn material is provided to an electrode, due to heat, Sn material may sputter away from the electrode, thereby providing depositable material. This may deposit on the optical element and/or on other parts of the lithographic apparatus. When depositing on other parts of the lithographic apparatus, or when the material has been provided to such other parts of the lithographic apparatus, for example a gas barrier, e.g. particles from the source and/or secondary particles, may subsequently remove at least part of this deposition or material, thereby enabling deposition on the optical element. Also one or one of the other methods mentioned above such as irradiation, thermal energy transfer, etc., may provide depositable material from material from parts of the lithographic apparatus. Hence, a number of deposition and redeposition schemes are possible, as shown in the table below:

| Source | | | | Target | Method/mechanism |
|---|---|---|---|---|---|
| Sn Source | | ⇨(1) | | Optical element | (a1) |
| Sn Source | ⇨ (1) | Part* of lithographic apparatus | ⇨(2) | Optical element | (a2) |
| Sn Source | ⇨ (1) | Material on part* of lithographic apparatus | ⇨(2) | Optical element | (a2b) |
| Non-Sn source with Sn on electrode(s) | | ⇨(1) | | Optical element | (b1) |
| Non-Sn source with Sn on electrode(s) | ⇨ (1) | Part* of lithographic apparatus | ⇨(2) | Optical element | (b2) |
| Non-Sn source with Sn on electrode(s) | ⇨ (1) | Material on part* of lithographic apparatus | ⇨(2) | Optical element | (b2b) |
| Non-Sn source with material on electrode(s) (non-Sn material) | | ⇨(1) | | Optical element | (c1) |
| Non-Sn source with material on electrode(s) (non-Sn material) | ⇨ (1) | Part* of lithographic apparatus | ⇨(2) | Optical element | (c2) |
| Non-Sn source with material on electrode(s) (non-Sn material) | ⇨ (1) | Material on part* of lithographic apparatus | ⇨(2) | Optical element | (c2b) |
| Non-Sn source | ⇨ (1) | Material on part* of lithographic apparatus | ⇨(2) | Optical element | (d) |

-continued

| Source | | | | Target | Method/ mechanism |
|---|---|---|---|---|---|
| Sn source with Sn on electrode(s) | | ⇒(1) | | Optical element | (e1) = (a1)/ (b1) |
| Sn source with Sn on electrode(s) | ⇒ (1) | Part* of lithographic apparatus | ⇒(2) | Optical element | (e2) = (a2)/ (b2) |
| Sn source with Sn on electrode(s) | ⇒ (1) | Material on part* of lithographic apparatus | ⇒(2) | Optical element | (e2b) = (a2b)/ (b2b) |
| Sn source with material on electrode(s) (non-Sn material) | | ⇒(1) | | Optical element | (f1) = (a1)/ (c1) |
| Sn source with material on electrode(s) (non-Sn material) | ⇒ (1) | Part* of lithographic apparatus | ⇒(2) | Optical element | (f2) = (a2)/ (c2) |
| Sn source with material on electrode(s) (non-Sn material) | ⇒ (1) | Material on part* of lithographic apparatus | ⇒(2) | Optical element | (e2b) = (a2b)/ (c2b) |

Part* of the lithographic apparatus is here e.g. a gas barrier, a support, a heat shield, an apparatus wall, a wall of a chamber of a source of radiation, and an edge of an aperture, but not an electrode. Material on electrodes, if present, is indicated in the most left column.

Method or mechanism (a1) is a method wherein the source is a Sn source, providing Sn as deposition to the optical element, e.g. a collector mirror. This is a first order process (indicated with step (1)). Higher order processes are also included, e.g. when Sn material from the source first (1) deposits on a part of the lithographic apparatus and this deposition is subsequently at least partially removed by Sn and/or other particles from the source (step (2)), thereby providing a Sn-deposition on the optical element. This latter process is indicated in the table as method or mechanism (a2). This is a second order process, although higher orders may also be included, since material may be deposited and removed several times before it finally deposits on the optical element.

In a variation thereon, the material can be provided to part of the lithographic apparatus. By, for example, particles from the Sn source or other particles (step (1)), at least part of this material is removed (step (2), thereby providing a deposition on the optical element. This is a second order process, indicated as (a2b). The resulting deposition on the optical element may include material derived from the material on part of the apparatus (a material including one or more elements selected from B, C, Si, Ge and/or Sn), but may also include Sn from the source (according to the mechanism of (a1) and/or (a2)).

The same three methods/mechanisms apply to non-Sn sources, for example Xe or Li discharge sources, which may have Sn on an electrode (methods (b1), (b2) and (b2b)). Method/mechanism (b1) is the method/mechanism wherein the source is a non-Sn source with Sn on the electrode(s), providing Sn as deposition to the optical element, e.g. a collector mirror. This is a first order process (indicated with (step (1)). Higher order processes are also included, e.g. when Sn material from the electrode(s) (step (1)) deposits on a part of the lithographic apparatus and this deposition is subsequently at least partially removed by particles and/or Sn from the source (step (2)), thereby providing a Sn-deposition on the optical element. This latter process is indicated in the table as method (b2). This is a second order process, although higher orders may also be included, since material may be deposited and removed several times, before it finally deposits on the optical element.

In a variation thereon, material according to the present invention can be provided to part of the lithographic apparatus. By particles from the source (step (1)), at least part of this material is removed (step (2)), thereby providing a deposition on the optical element. This is a second order process, indicated as (b2b). The deposition on the optical element as a result of method (b2b) may include material derived from the material on part of the apparatus (a material including one or more elements selected from B, C, Si, Ge and/or Sn), but may also include Sn from the deposition on the electrodes of the source (according to the mechanism of (b1) and/or (b2)).

Further, the same three methods/mechanisms also apply to non-Sn sources which may include a non-Sn material on an electrode. Method (c1) is the method wherein the source is a non-Sn source with non-Sn on the electrode, (i.e. B, C, Si and/or Ge) providing this material as deposition to the optical element, e.g. a collector mirror. This is a first order process (indicated with (step (1)). Higher order processes are also included, e.g. when the non-Sn material from the electrode(s) (step (1) deposits on a part of the lithographic apparatus and this deposition is subsequently at least partially removed by particles from the source and/or non-Sn material from the electrodes of the source (step (2), thereby providing a non-Sn deposition including B, C, Si and/or Ge on the optical element. This latter process is indicated in the table as method (c2). This is a second order process, although higher orders may also be included, since material may be deposited and removed several times, before it finally deposits on the optical element.

In a variation thereon, material according to the present invention can be provided to part of the lithographic apparatus. By particles from the source (1), at least part of this material is removed (2), thereby providing a deposition on the optical element. This is a second order process, indicated as (c2b). The deposition on the optical element as a result of method (b2b) includes material derived from the material on part of the apparatus (a material including one or more elements selected from B, C, Si, Ge and/or Sn), but may also include the non-Sn material from the source (according to method (c2)).

Another method or mechanism is (d), wherein the source is a non-Sn source, for example a Li or Xe source, without any material according to the present invention on an electrode, but with the material on part of the apparatus. Particles from the source remove at least part of the material thereby providing in a second order process material to the optical element. In an embodiment, the method is used in combination with a laser-produced plasma source.

Methods (a2), (b2) and (c2) include redeposition methods, and methods (a2b), (b2b) and (c2b) may include redeposition. Further, method (d) may include redeposition (when part of the material on part of the apparatus is first deposited on another part of the apparatus). Desired methods/mechanisms include (a2), (a2b), (b1), (b2), (b2b), (c1), (c2), (c2b) and (d). More desired methods include (a2), (a2b), (b2), (b2b), (c2), (c2b) and (d). Even more desired methods include (a2b), (b2b), (c2b) and (d), which are methods wherein the material is provided to a part of the lithographic apparatus before use of the lithographic apparatus and which include second order methods. The part of the lithographic apparatus including the material desirably includes a gas barrier.

It should be appreciated that one or more of the mechanisms of (a1), (a2) (a2b), (b1) (b2), (b2b) apply to the method in a next embodiment, wherein Sn is provided to a Sn source, for example an embodiment wherein Sn is provided to one or more Sn electrodes, and that one or more of the mechanisms of (a1), (a2) (a2b), (c1) (c2), (c2b) ) apply to the method wherein non-Sn material is provided to a Sn source, for example an embodiment wherein B, C, Si and/or Ge is provided to one or more Sn electrodes.

In an embodiment, the material is provided by a wetting, coating and/or impregnating. For example, the part of the apparatus, such as a gas barrier, may be coated with a solution or suspension including Sn, for example a solution containing Sn salts such as stannic nitrate or stannic chloride, thereby providing a film or coating including Sn on the part of the apparatus. In yet a further embodiment, Sn is provided to the part (e.g. a heat shield, a gas barrier, a support, an apparatus wall, a wall of a chamber of a source of radiation, an electrode, and/or an edge of an aperture) of the apparatus by dipping the part, or one or more components of the part, in molten Sn. According to yet another embodiment of the present invention, B, C, Si, Ge and/or Sn are provided to the part of the apparatus by chemical vapor deposition. This can be done before assembly of the apparatus or after assembly, and may even be done during use, as described in U.S. patent application Ser. No. 10/956,344, which is incorporated herein by reference.

Further, the part of the apparatus may have a surface of which at least part is porous, e.g. a gas barrier with a surface layer including a porous W layer or a porous Mo layer. Such a porous structure may be desirable for methods such as wetting, coating and/or impregnating. In another embodiment, the material is provided by wetting with a metal, for example Sn. However, also any other material which 1) after deposition on the optical element can at least partially be removed from the optical element by hydrogen or a halogen, and which desirably 2) is wettable, may be used. Hence, in an embodiment, the material that is used includes a material that is wettable. In another embodiment, the part of the lithographic apparatus to which the material is provided is used at a temperature that enables wetting. In another embodiment, the surface of the part of the lithographic apparatus or the surface of the optical element is heated such that a wettable element or compound is wetted over the surface. In another embodiment, the temperature of the surface of the part of the lithographic apparatus or the surface of the optical element is controlled by, for example cooling elements and/or heating elements.

In another embodiment, before providing the material to the one or more parts of the lithographic apparatus (for example a gas barrier) or an electrode, a layer including an adhesion and/or wettability improving material is provided. For example, to improve formation of a Sn layer on a gas barrier, the gas barrier may at least partially be provided with a Cu layer on its surface.

According to another embodiment of the present invention, the optical element includes a mirror, a grating, a reticle and/or a sensor, for example a collector mirror. In an embodiment, the temperature of the optical element, e.g. of the collector mirror, can be adjusted such that wetting of the material is enabled, for example when Sn is used (see also above).

According to another embodiment, a method for protection of an optical element for a lithographic apparatus including a source of radiation, a part including a gas barrier, a support, an apparatus wall, a wall of a chamber of a source of radiation, and/or an edge of an aperture; the source of radiation, if in use, providing a plasma including Sn; the method including a) providing the plasma including Sn, thereby providing a Sn deposition on the one or more parts of the lithographic apparatus; b) providing the optical element to the apparatus; c) providing the plasma including Sn, thereby providing a Sn deposition to the optical element.

Herein, (a) the source first provides Sn to the one or more parts of the lithographic apparatus, in the absence of the optical element, such as a mirror, a grating, a reticle and a sensor. Hereby, Sn deposition (material, as described above) is provided to one or more parts of the lithographic apparatus. Thereafter, (b) the optical element is provided to the lithographic apparatus. Then, (c) the deposition or material is at least partially removed during use from parts of the lithographic apparatus and deposited on the optical element. Hence, at least part of Sn deposition on the one or more parts of the lithographic apparatus obtained during procedure a) is removed by collision with particles from the source of radiation with the Sn deposition on the one or more parts of the lithographic apparatus during procedure c), or by one of the other mechanisms mentioned above, for example irradiation, heating, etc. This method may be used in methods (a2), (a2b), (b2) and (b2b). In such embodiments, first the Sn source provides material to the part of the lithographic apparatus in the absence of the optical element (only the first order process takes place) and then (after a sufficient layer of Sn is provided), the optical element is provided, which is then, substantially in a second order process, provided with the deposition. However, first order processes may also take place, since direct deposition (one step deposition) cannot be excluded.

According to yet another embodiment, the deposition layer (i.e. material) is at least provided to one or more of those parts as mentioned above of the lithographic apparatus where the beam of radiation impinges on the surface of the one ore more of those parts. The material, including material of the layer, may include a compound or a number of compounds including one or more elements selected from B, C, Si, Ge and/or Sn, such as elementary layers or layers including BN, SiC, $Si_3N_4$, GeC, $Ge_3N_4$, and layers including oxides and/or oxynitrides of Si, Ge and/or Sn, and also layers including alloys of compounds including one or more elements selected from B, C, Si, Ge and/or Sn. In an embodiment, the layer includes at least about 20 wt. %, e.g. 20–100 wt. % of the one or more elements, desirably at least about 35 wt. % of the layer, e.g. 35–100 wt. %. Elemental layers or nitride layers may include oxygen impurities. In yet a further embodiment, the part of the lithographic apparatus provided with a material including one or more elements selected from B, C, Si, Ge and/or Sn includes the material on about 20–100% of its surface that receives direct radiation from the source, desirably about 40–100% of its surface. In another embodiment, the layer thickness is between about 5–200 µm, for example between about 10–100 µm. In another embodiment, the part of the apparatus including 20–100% of its surface that receives direct radiation from the source (i.e. in line-of-sight with the plasma source), desirably about 40–100% of its surface with material according to the invention includes the abovementioned layer thickness between about 5–200 µm over 20–100% of its surface that receives direct radiation from the source, desirably about 40–100%.

In an embodiment, wherein material is provided to one or more electrodes of the source, the material does not include a material of the plasma. In another embodiment, wherein the material is provided to an electrode, the material does not include Sn (i.e. no Sn is provided to an electrode, wherein the electrode(s) and the apparatus that will use the electrode(s) are designed to provide a non-Sn plasma, for example a Xe or Li plasma).

In yet a further embodiment of the invention, the optical element, before use in an apparatus, includes a protective layer, e.g. a protective layer including Sn. This may be a layer of about 1 nm–100 nm. In yet a further embodiment, this layer is about 2–20 nm. In another embodiment, the layer has a layer thickness of about 5–20 nm, e.g. 5–10 nm.

In another embodiment of the present invention, a lithographic apparatus includes an illumination system configured to condition a radiation beam; a support configured to support a patterning device, the patterning device configured to impart the radiation beam with a pattern in its cross-section to form a patterned radiation beam; a substrate table configured to hold a substrate; a projection system configured to project the patterned radiation beam onto a target portion of the substrate; an optical element; a source of radiation; a part of the lithographic apparatus selected from a gas barrier, the support, an apparatus wall, a wall of a chamber of the source of radiation and/or an edge of an aperture having a deposition including one or more elements selected from B, C, Si, Ge and/or Sn, wherein the deposition has a layer thickness of 5–200 µm. In addition, an electrode may include such a deposition layer.

In an embodiment, the optical element is a mirror, a grating, a reticle and/or a sensor, for example a collector mirror. According to another embodiment, the apparatus is a lithographic apparatus for EUV lithography.

The protective layer on the optical element can be removed by providing atomic hydrogen or a halogen gas or a combination thereof, as described in U.S. patent application Ser. No. 10/956,344, which is incorporated herein by reference. Hence, in yet a further embodiment, the material that is used can, after deposition on the optical element, at least partially be removed from the optical element by hydrogen or a halogen.

Figure 3:
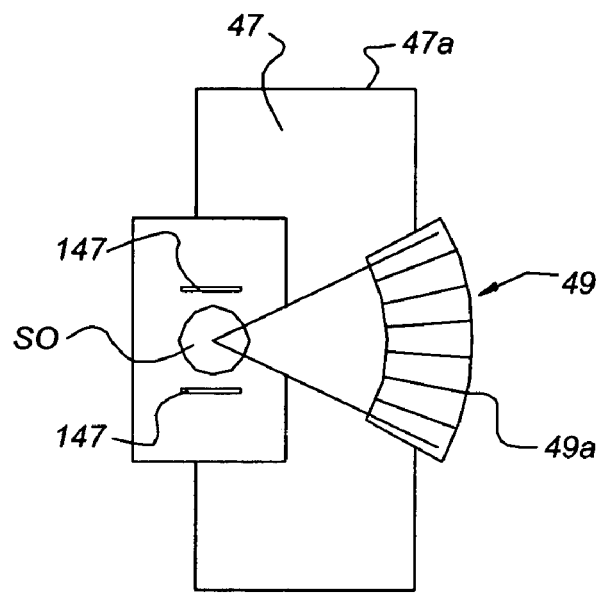
FIG. 3 depicts a detail of the lithographic apparatus as depicted in FIG. 2.
Figure 4:
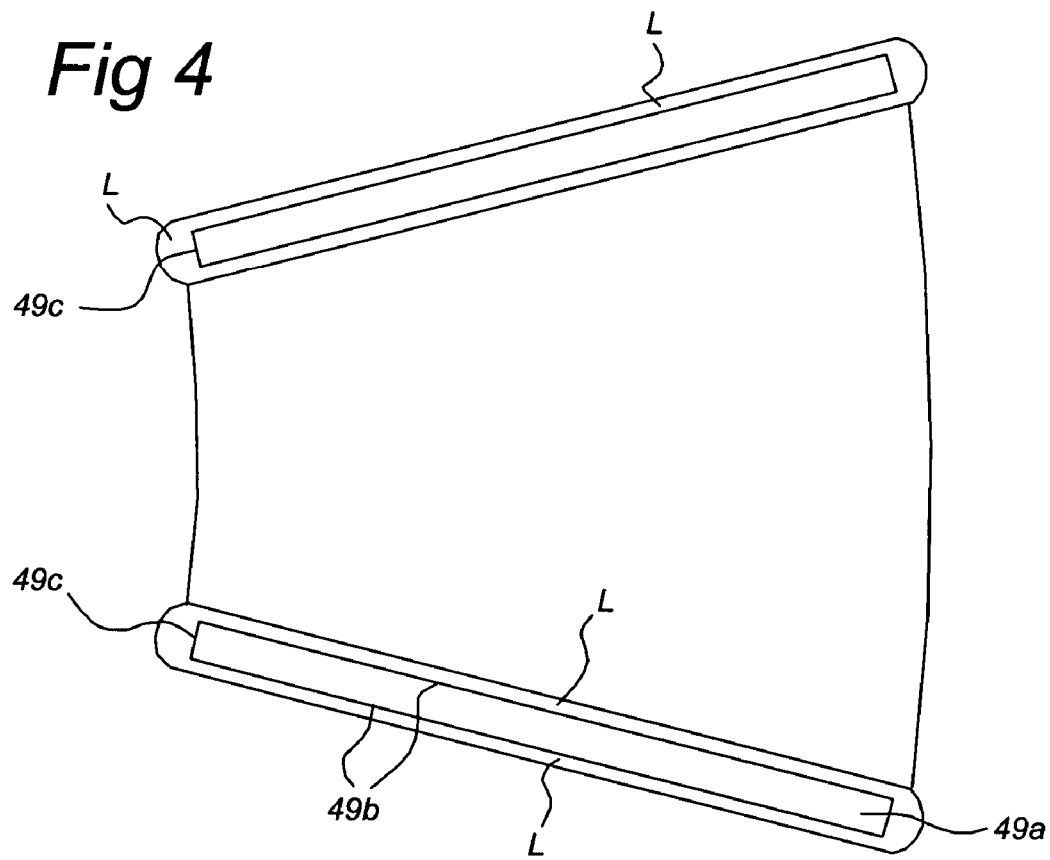
FIG. 4 depicts a detail of the gas barrier.

In the context of the present invention, "optical element" includes one or more elements selected from optical filters, optical gratings, mirrors, for example multilayer mirrors, grazing incidence mirrors, normal incidence mirrors, collector mirrors (for example as described in U.S. Patent Application Publication 2004/0094724 A1, which is incorporated herein by reference, and shown in FIGS. 3 and 4), etc, lenses, reticles, diodes, sensors, for example intensity measurements sensors, energy sensors, CCD sensors, alignments sensors, like optical alignment sensors, gas barriers (for example as described in U.S. Pat. No. 6,614,505, 6,359,969, and 6,576,912, which are incorporated herein by reference), etc. Gas barriers are also called contaminant filters, debris filter, debris suppression means, foil traps, etc. Optical elements, such as filters, gratings, mirrors or lenses may be flat or curved and may be present as layer, foil, device etc. In an embodiment of the present invention, optical elements such as optical filters, optical gratings, mirrors, such as multilayer mirrors, grazing incidence mirrors, normal incidence mirrors, collector mirrors, lenses, etc., may be blazed or optimized, e.g. for radiation with a predetermined wavelength $\lambda$ (such as 5–20 nm, i.e. EUV radiation, e.g. about 13.5 nm; 248 nm; 193 nm; 157 nm; or 126 nm, etc). They may also be transmissive to radiation with wavelengths $\lambda$, e.g. in the case of lenses, or reflective, e.g. in case of mirrors, or diffractive, e.g. in the case of gratings. Some optical elements may provide one or more of these optical effects, see e.g. European Patent application no. 03077155 and European Patent application no. 03077850, which are incorporated herein by reference. The terms "radiation" and "beam" used herein encompass all types of electromagnetic radiation, including ultraviolet (UV) radiation (e.g. having a wavelength $\lambda$ of 365, 248, 193, 157 or 126 nm) and extreme ultra-violet (EUV or soft X-ray) radiation (e.g. having a wavelength in the range of 5–20 nm), as well as particle beams, such as ion beams or electron beams. Generally, radiation having wavelengths between about 780–3000 nm (or larger) is considered IR radiation. UV refers to radiation with wavelengths of approximately 100–400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100–200 nm. DUV is Deep UV, and is usually used in lithography for the wavelengths produced by excimer lasers such as 126 nm–248 nm. It should be appreciated that radiation having a wavelength in the range of e.g. 5–20 nm relates to radiation with a certain wavelength band with, of which at least part of it is found in the range of 5–20 nm.

The term "layer" used herein, as should be appreciated, may describe layers having one or more boundary surfaces with other layers and/or with other media like vacuum (in use). However, it should be appreciated that "layer" may also mean part of a structure. The term "layer" may also indicate a number of layers. These layers can be, for example, next to each other or on top of each other, etc. They may also include one material or a combination of materials. It should also be noted that the term "layer" used herein may describe continuous or discontinuous layers. In the present invention, the term "material" may also be interpreted as a combination of materials. Material refers to additional material on existing surfaces, like a deposition including the material provided to an apparatus wall. During operation conditions, the material is solid (e.g. Si coating) or liquid (e.g. Sn wettable material). The term "deposition" herein refers to material that is chemically or physically attached to a surface (e.g. the surface of an optical element), as known to those of ordinary skill in the art. Such deposition may be a layer, but it may also include a multi-layer structure. The deposition may also include redeposition products or evaporation products. Material can be provided as deposition. The term "element" in the phrase "one or more elements selected from B, C, Si, Ge and/or Sn", herein refers to a material, deposition or redeposition including these elements, or including particles including such elements, or including compounds (like Si oxides, Si carbides, Sn-salts, Sn oxides, etc.) including these elements, or combinations thereof, as will be known to those of ordinary skill in the art. The phrase "deposition including one or more elements selected from B, C, Si, Ge and/or Sn", may refer to mono- or multi-layers including atomic B, C, Si, Ge and Sn and combinations thereof, for example mono- or multi-layers including of metallic Sn.

The term "depositable material" refers to a material including one or more elements selected from B, C, Si, Ge and/or Sn, that is either (i) released from the electrode(s), and/or (ii) from the plasma and/or (iii) removed from the material on a part of the lithographic apparatus by, for example, particles from the electrode or by another mechanism like thermal irradiation, or irradiation by the source (ablation), and which can deposit on the optical element. In general, it is material that can form the deposition, according to the present invention, and that is released from a surface as a particle, thereby forming depositable material (particles, elemental particles), i.e. material that can deposit on the optical element. The phrase "a material including one or more elements selected from B, C, Si, Ge and/or Sn" refers to compounds (e.g. Si oxide, Sn oxide), carbides, metals and elements of B, C, Si, Ge and/or Sn, but may also refer to alloys of one or more of these elements, e.g. Cu—Sn alloys. Herein, "Sn electrode" is used as short notation for an electrode that is used for providing a Sn plasma for use in a lithographic apparatus. Herein, "Sn material" is used as definition of materials including Sn. Such materials may also include other elements, including for example Si, B, Ge and/or C, but at least includes Sn. The term "non-Sn electrode" refers to an electrode that is used to create a non-Sn plasma, for example a Li or Xe plasma. Nevertheless, such electrode may be coated, wetted or impregnated with a Sn including material, such that the plasma may also include Sn particles, e.g. due to a thermal induced release of the Sn material from the electrode. The term "non-Sn material" refers to material that does not substantially include Sn (<1 wt. %).

The term "first order" process or mechanism refers to a process wherein material that is released from the electrode(s) or from the plasma, without being deposited elsewhere, deposits on the optical element. All material that is deposited on parts of the lithographic apparatus and released by particles from the source and then deposits on the optical element is deposited in second or higher order processes (depending on the number of redeposition steps).

Some embodiments will now be described in more detail.

FIG. 1 FIG. 1 schematically depicts a lithographic apparatus according to an embodiment of the present invention. The apparatus 1 includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PL is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted-mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory processes may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source SO and the lithographic apparatus 1 may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam PB is incident on the patterning device (e.g., mask MA), which is held on the support (e.g., mask table MT), and is patterned by the patterning device. Having traversed the mask MA, the radiation beam PB passes through the projection system PL, which projects the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

Figure 2:
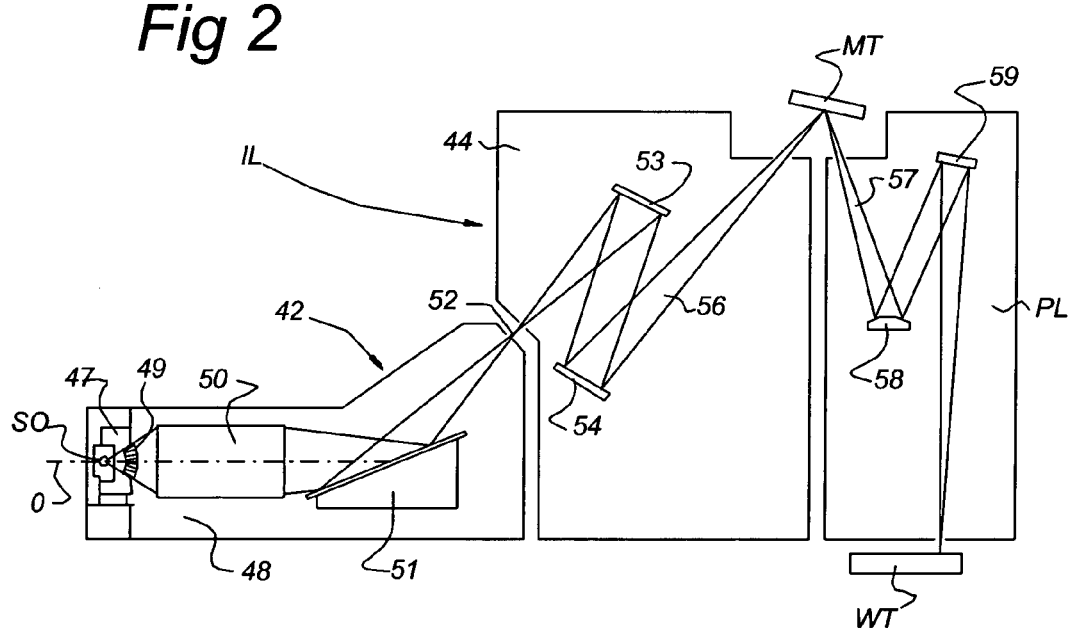
FIG. 2 depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas, Li vapor or Sn vapor in which a very hot plasma is created to emit radiation in the EUV range of the electromagnetic spectrum. The very hot plasma is created by causing a partially ionized plasma of an electrical discharge to collapse onto an optical axis O. Partial pressures of 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contamination trap 49 (which is positioned in or behind an opening in source chamber 47). The gas barrier 49 includes a channel structure such as, for example, described in detail in U.S. Pat. Nos. 6,614,505, 6,359,969, and/or 6,576,912, which are incorporated herein by reference.

The collector chamber 48 includes a radiation collector 50 which may be formed by a grazing incidence collector. Radiation passed by collector 50 is reflected off a grating spectral filter 51 to be focused in a virtual source point at an aperture 52 in the collector chamber 48. From collector chamber 48, a radiation beam 56 is reflected in illumination optics unit 44 via normal incidence reflectors 53, 54 onto a reticle or mask positioned on reticle or mask table MT. A patterned beam 57 is formed which is imaged in projection optics system PL via reflective elements 58, 59 onto wafer stage or substrate table WT. More elements than shown may generally be present in illumination optics unit 44 and projection system PL.

Radiation collector 50 may be a radiation collector as described, for example, in U.S. Patent Application Publication 2004/0094724 A1, which is incorporated herein by reference.

All optical elements shown in FIG. 2 (and optical elements not shown in the schematic drawing of this embodiment) are vulnerable to deposition of, for example, Sn and/or damage by other fast atoms and particles, for example Li, depending upon the source. This is especially the case for radiation collector 50 and grating spectral filter 51 or a spectral purity filter. Hence, the method of the invention can be applied to those optical elements, but also to normal incidence reflectors 53, 54 and reflective elements 58, 59.

Embodiment 1

Referring to FIGS. 2 and 3, a material including one or more elements selected from B, C, Si, Ge and/or Sn is provided, which is arranged such that the source, if in use, causes removal of at least part of the material, thereby providing depositable material. Hence, the material may be provided on at least part of the electrodes 147 of a source, on part of the walls 47*a* of a source chamber 47, on part of the surface of gas barrier 49, such as the plates 49*a* of the channels of gas barrier 49, on edges of those plates, in particular the edges directed to source SO, on edges of aperture 52, on edges of collimator mirror 50, on supports of gas barrier 49, collimator mirror 50, mirror 51, mirrors 53 and 54, on at least part of the walls of radiation sytstem 42 or illumination system 44, etc. Further, the material is provided such that at least part of the depositable material deposits on the optical element. When using the source, part of the material is removed and forms thereby depositable material which will redeposit on the part of the apparatus or somewhere else, and at least part of the depositable material will deposit on an optical element. Hence, the material is either provided on electrodes 47 of source SO and/or on parts of the lithographic apparatus between source SO and the optical element. Optical elements which are protected according to the method of the invention include, for example, mirrors, 50, 51, 53 and 54.

In this way, instead of avoiding deposition, a deposition is deliberately provided to the optical element that can be removed. Without providing the material to the electrode or part of the lithographic apparatus, due to for example collision of particles from the source with parts of the lithographic apparatus, other deposition is deposited on optical element 50, for example Al, Fe, Mo, W, etc., that cannot easily be removed by hydrogen a halogen, or combinations thereof. The material according to the present invention can be removed relatively easily by providing hydrogen radicals, as described by U.S. patent application Ser. No. 10/956,344, which is incorporated by reference, or by halogens, or by combinations thereof. Hydrides or halogenides are formed, that can be removed by a getter and/or by an exhaust. In addition, hydrogen may also be provided, which can reduce the compounds of the deposition, e.g. silicon oxide may be reduced to Si, which can then subsequently be removed by hydrogen radicals and/or halogens.

In a variation, a wettable material is used, for example Sn. This provides a smooth layer on the part of the apparatus to which the material is provided, but it may also provide a smooth layer through wetting on optical element 50. To this end, optical element 50 may be heated to wetting temperatures (e.g. 230–500° C. for Sn), either by external heating, for example as described in EP-A-03078316.1 and U.S. patent application Ser. No. 10/956,344, which are incorporated by reference, or by the radiation of the source, or by both. The melting point of Sn is about 232° C. The wetting temperature depends upon the surface and other parameters, including pressure.

In a variation, all parts of the lithographic apparatus in line-of-sight with the plasma source and between the source and the optical element are provided with material on about 20–100% of the surface of these parts in line-of sight with the plasma source (surface that receives direct radiation from the source). The layer thickness is between about 5–200 μm.

Embodiment 2 (e.g. Methods (d), (a2b), (b2b) and (c2b))

Referring to FIGS. 2 and 3, in this embodiment optical element 50, i.e. the collector mirror, is protected with a protective layer by providing a material including one or more elements selected from B, C, Si, Ge and/or Sn to one ore more selected of the group of gas barrier 49 (to the surface 49*b* and/or edges 49*c* of parallel elements 49*a*), to at least part of walls 47*a* of source chamber 47 or to a support of one of these (such as supports for the collector, which are not shown in this schematic drawing, but which are known to those of ordinary skill in the art), thereby arranging the material such that the source, if in use, causes removal of at least part of the material, thereby providing depositable material. This removal of at least part of the material is a result of, for example, collision of particles of the source on the surface of the material, thereby providing depositable material. When in use, at least part of the depositable material deposits on optical element 50. Thereby, deposition is formed on optical element 50, that can relatively easily be removed by atomic hydrogen, a halide gas, or both (see above).

In a variation, the material is provided to part of the lithographic apparatus in situ and removed from the optical element in situ, according to the methods described in U.S. patent application Ser. No. 10/956,344.

Embodiment 3 (e.g. Methods (a2), (b2) and (c2))

Referring to FIGS. 2 and 3, in this embodiment optical element 50, i.e. the collector mirror, is protected with a protective layer by providing a material including one or more elements selected from B, C, Si, Ge and/or Sn to one or more of the electrodes 147. When in use, at least part of the material is released from the electrode. This removal of at least part of the material is a result of the high temperature of the source which leads to a release of particles which include depositable material. At least part of the depositable material deposits on other parts of the apparatus, like walls 47*a,* gas barrier 49 (parallel plates 49*a*) etc. Due to collision of particles from source SO, either from the electrodes 147 or from the material on electrodes 47, the deposition is at least partly subsequently removed from these parts and forms a deposition on optical element 50. Next to these mechanisms, also first order deposition may take place (as described below).

Embodiment 4 (e.g. Methods (b1) and (c1))

Referring to FIGS. 2 and 3, in this embodiment optical element 50, i.e. the collector mirror, is protected with a protective layer by providing a material including one or more elements selected from B, C, Si, Ge and/or Sn to one or more of the electrodes 147 such that (i) the source, if in use, causes removal of at least part of the material, thereby providing depositable material. This removal of at least part of the material is a result of the high temperature of the source which lead to a release of particles which include depositable material. When in use, at least part of the depositable material deposits on optical element 50. When using these methods, usually also methods (a2), (b2) and (c2) will occur.

Embodiment 5 (Method (a1))

Referring to FIGS. 2 and 3, in this embodiment optical element 50, i.e. the collector mirror, is protected with a protective layer including Sn by using a Sn source, such that (i) the source, if in use, provides depositable material. This removal of at least part of the material is a result of the high temperature of the source which lead to a release of particles which include depositable material. When in use, at least part of the depositable material deposits on optical element 50.

Embodiment 6 (Method (a1), and Methods (b1) and (c1))

In this embodiment, there is provided by source SO a plasma including Sn (either due to the Sn electrodes (see e.g. embodiment 5; method (a1)) or due to presence of Sn on the electrodes of a non-Sn source (e.g. embodiment 4, method (b1)) is provided, resulting in a deposition including Sn to the one or more parts of the lithographic apparatus; or due to a non-Sn material on an electrode (Embodiment 4, method (c1)) a deposition to the one or more parts of the lithographic apparatus, in the absence of the optical element, such as optical element 50.

Subsequently, the optical element is provided (step b). Then, the method continues by c) providing the plasma including Sn, thereby providing a Sn deposition to the optical element, not only via mechanisms (a1) or (b1), but also via mechanism (a2) or (b2) since part of the deposition on parts of the lithographic apparatus will be removed by, for example, fast particles from the source and/or also Sn from the source; or the source provides particles, such as non-Sn particles or other fast particles, thereby not only providing non-Sn deposition via mechanism (c1), but also via mechanism (c2), respectively.

Before providing the optical element (step b) one may test the performance of the lithographic apparatus by providing a "witness sample" (as known to those of ordinary skill in the art, for example a device having substantially the same dimensions of the optical element but including, for example, Si) at the position of the optical element. When the source SO is in use, deposition will be provided to the witness sample. By measuring in situ or ex situ the composition of the deposited material on the witness sample, one may determine when the deposition including Sn to the one or more parts of the lithographic apparatus is sufficient. For example in the case of a Sn deposition, when the deposition includes 50 wt. % or more Sn, for example 80–100% wt. %, the deposition including Sn to the one or more parts of the lithographic apparatus may be sufficient, such that the optical element can be provided to the apparatus. In case this value is not reached, one or more parts of the lithographic apparatus may be provided with Sn via other mechanisms such as in situ or ex situ sputtering, dip coating, wetting, etc. Sputtering by the source of Sn or providing in other ways is typically sufficient when the layer including the material of the invention that is formed has a layer thickness of about 5–200 µm, for example between about 10–100 µm.

Embodiment 7

A material including one or more elements selected from B, C, Si, Ge and/or Sn, for example compounds such as Si oxide, Sn oxide, carbides, metals and elements of B, C, Si, Ge and Sn, or alloys of one or more of these elements, e.g. Cu—Sn alloys are provided to one ore more of the gas barrier 49 (to the surface and/or edges of parallel elements 49a), to at least part of walls 47a of source chamber 47, to a support or to one ore more of the electrodes 147, etc. by one or more of the following methods of wetting, coating and/or impregnating.

Wetting is performed by providing, for example by sputtering, CVD or PVD, etc. a wettable compound of B, C, Si, Ge and/or Sn to the surface of the gas barrier, walls, electrodes, etc. while heating the surface simultaneously and/or subsequently. This method may be used for Sn. In order to improve wetting, e.g. the walls or the gas barrier may include a Cu layer (e.g. 10–100 nm), on which the wettable compound is provided. This method of wetting can be applied to the part of the lithographic apparatus before assembling the lithographic apparatus, although in situ sputtering, CVD, or PVD is also possible according to U.S. patent application Ser. No. 10/956,344, which is incorporated herein by reference.

Coating can be performed by providing, e.g. by sputtering, CVD, PVD, dip coating (e.g. in liquid Sn), spraying, etc. a compound, e.g. as nitride, oxynitride, oxide or as salt (chloride, nitrate, etc.), in solution or as slurry, to the surface of the gas barrier, walls, electrodes, etc. This method of coating can be applied to the part of the lithographic apparatus before assembling the lithographic apparatus.

Impregnation can be performed by dip coating, spraying, etc. a compound, e.g. as nitride, oxynitride, oxide or as salt (chloride, nitrate, etc.), in solution or as slurry, to the surface of the gas barrier, walls, electrodes, etc., when the surface thereof is porous (e.g. 10–50 vol. % of the material includes pore volume), as will be known to those of ordinary skill in the art. This method of impregnating can be applied to the part of the lithographic apparatus before assembling the lithographic apparatus.

Embodiment 8

In this embodiment, the gas barrier 49 is first coated by known with a thin Cu layer, e.g. 10–100 nm, before using in a lithographic apparatus with either a Sn source, or a source with electrodes 147 with Sn provided to one or more electrode(s) 147. The internal surface, i.e. the surface of plates 49a is provided with Cu for at least 20–50% of the total area of this surface.

In a variation on this embodiment, the gas barrier is provided with Cu and subsequently provided with Sn. By heating, Sn is wetted over the surface of the gas barrier. Providing Sn to the gas barrier may be done before use in the apparatus.

Embodiment 9

Referring to embodiments 7 or 8, for example, one or more parts of the apparatus, such as a gas barrier, a support, an apparatus wall, a wall of a chamber of a source of radiation, an electrode, and/or an edge of an aperture, are dipped in a bath of molten Sn. For example, the part may be an electrode of Mo or W, a gas barrier having, for example, a coating of Mo or W, etc. The Mo or W electrode or coating may be porous. After providing a layer of about 5–200 μm, the part of the apparatus is provided to the apparatus.

In a variation, all parts of the lithographic apparatus in line-of-sight with the plasma source and between the source and the optical element are provided with material on about 20–100% of the surface of these parts in line-of sight with the plasma source (surface that receives direct radiation from the source). The layer thickness is between about 5–200 μm.

The process of providing the Sn coating to the part of the apparatus is preferably performed during or before assembly of the apparatus.

Embodiment 10

The source of the apparatus is a source providing a Sn plasma.

Embodiment 11

In this embodiment, the source is a Xe source, and the material is provided to gas barrier 49.

Embodiment 12

Figure 5:
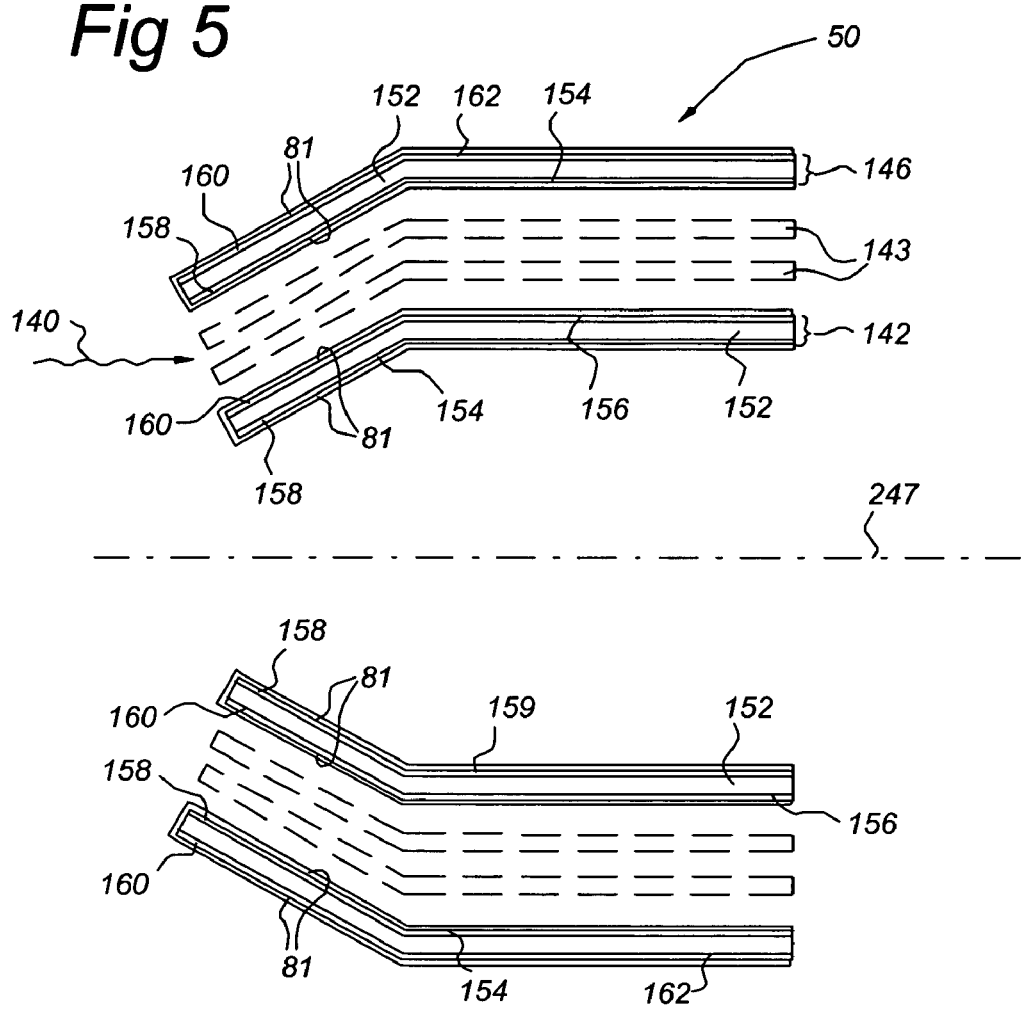
FIG. 5 depicts an axial cross-sectional view of a collector mirror according to an embodiment of the present invention.

This embodiment describes deposition to the collector mirror 50. As can be seen in FIG. 3 of U.S. Patent Application Publication 2004/0094724 A1, which is incorporated by reference, the grazing incidence collector 10 includes a number of nested reflector elements. A grazing incidence collector of this type is, for example, also shown in German patent application DE 101 38 284.7. As indicated in FIG. 5 and FIG. 2, a collector 50 is aligned along an optical axis, indicated in FIG. 5 with reference number 247. The collector 50 may include several reflectors 142, 143, 146. An example of such a collector is shown in FIG. 2 with reference number 50. In FIG. 5, the inner reflector is indicated by reference number 142, the outer reflector is indicated by reference number 146. In between the reflectors 142 and 146 several other reflectors 143 may be located, the outlines of which are shown in FIG. 5 with dashed lines. All the reflectors 142 and 146 are coated on their backing layer 152 with a reflective layer or number of reflective layers selected from layers with reference numbers 154, 156, 158 and 159, as described in U.S. Patent Application Publication 2004/0094724 A1. Other layers may also be present, for example layers 160 and 162, as described in U.S. Patent Application Publication 2004/0094724 A1, of which one or more of them may also include reflective layers.

On top of one or more layers selected from layers 154, 156, 158 and 159, material according to the invention may be provided as layer 81, for example an Sn layer of 1–20 nm. Thereby, at least part of the reflection surface that receives radiation of source SO and receives particles from the source SO is protected by a protective layer. Layer 81 may also be provided to the edges of the reflectors (shown at the left side (source side)). Layer 81 may be provided to collector 50 before arranging the collector 50 in the lithographic apparatus.

Figure 6:
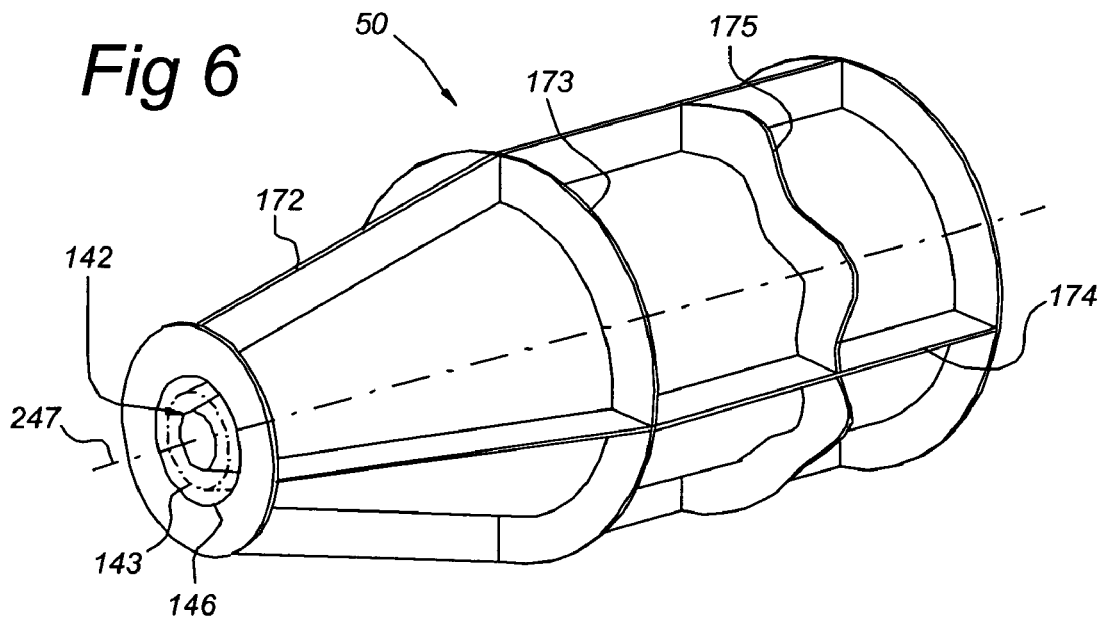
FIG. 6 depicts a collector equipped with radiation fins.

In FIG. 6 a collector 50 is shown which has on its outer reflector 146 several radiation fins 172–175 attached. These radiation fins 172–175 may be arbitrarily distributed on the outer reflector 146. The radiation fins 172–175 may increase the heat/infrared "black body" reflecting properties of the collector 50 even further. The edges of reflectors 142, 143, 146 (etc.) may be provide with a layer 81 (not shown in FIG. 6), as well as the fins 172–175.

Embodiment 13

Referring to FIG. 4, a gas barrier or contaminant barrier 49, includes two plates 49a from one of the contaminant barriers as described above, providing one of the channels of this barrier, with edges 49c directed to source SO (not shown in this figure). The surface of edges 49c and/or the surfaces 49b of channel plates 49a can be provided with a layer L with material according to the present invention. Note that in this schematic drawing the two plates 49a have not been drawn substantially parallel.

For example, the layer L can include about 20 wt. %, e.g. 20–100 wt. % of the one or more elements, for example Sn. In a variation, this layer L includes metallic Sn, provided by CVD and/or wetting. Preferably, this the part of the lithographic apparatus includes the material on about 20–100% of its surface that receives direct radiation from the source, for example about 40–100% of its surface. In FIG. 4, the complete surface of edge 49c, inner and outer surfaces 49b of plate 49a includes layer L. The layer thickness is between about 5–200 μm, in a variation between about 10–100 μm. At least 20% of this layer L has this layer thickness, or the entire layer L with material according to the invention includes this layer thickness.

Embodiment 14

Figure 7A:
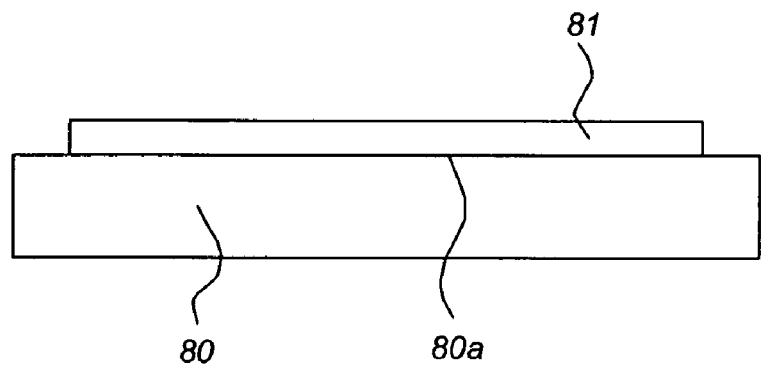
FIGS. 7a and 7b depict layers including deposition on an optical element or a part of the lithographic apparatus according to an embodiment of the invention.
Figure 7B:
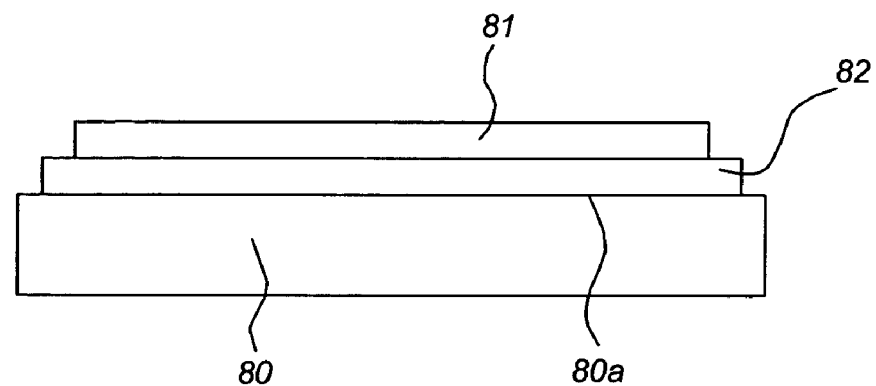

Referring to FIGS. 7a and 7b, schematically a layer according to the invention is depicted. FIGS. 7a and 7b either refer to an optical element, such as optical elements 50, 51, etc., and are indicated here with reference number 80; or refer to a part of the apparatus, such as a gas barrier 49, a support (not explicitly shown in the figures), an apparatus wall (for example wall 47a, but also other walls of other chambers are included), a wall of a chamber of a source of radiation (here explicitly wall 47a), an electrode 147, and an edge of an aperture 52 (not explicitly shown in the figures), a heat shield (not explicitly shown in the figures), an edge 49c of a contaminant barrier plate 49a etc., here also indicated with reference number 80.

Each of such elements or parts have a surface, schematically indicated with reference number 80a. Referring to FIG. 7a, part of this surface, in particular the part in view of the source, may include a layer 81, including the material of the present invention. When reference number 80 refers to optical elements, this layer will be between about 1–100 nm, for example between about 5–20 nm, thereby providing an EUV transparent and protective layer.

When reference number 80 refers to a part of the apparatus, the layer 81 has a thickness between about 5–200 μm, for example between about 10–100 μm, thereby providing a layer of which at least part of the material can be removed by one or more methods selected from collision of particles from the source of radiation with the material, irradiation of the material and transfer of thermal energy to the material, and thereby providing a removable deposition on optical elements. For example, layer 81 may include Sn, C or Si.

In a variant wherein reference number 80 refers to a part of the apparatus, a layer 82 may be provided for improving, for example wetting, for example a Cu layer, or other layers known to those of ordinary skill in art.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be appreciated that modifications may be made to the present invention as described without departing from the scope of the claims set out below.

J The present invention is not limited to application of the lithographic apparatus or use in the lithographic apparatus as described in the embodiments. Further, the drawings include those elements and features that are necessary to understand the present invention. Beyond that, the drawings of the lithographic apparatus are schematically and not on scale. The present invention is not limited to those elements, shown in the schematic drawings (e.g. the number of mirrors drawn in the schematic drawings). Further, the present invention is not limited to the lithographic apparatus described in Embodiment 1 and in FIGS. 1 and 2. It should be appreciated that embodiments described above may be combined.

What is claimed is:

1. A method for the protection of an optical element from a contamination source in a lithographic apparatus, the contamination source having a surface, comprising a first material, from which, in use, particles of the first material would be emitted towards the optical element due to radiation emitted towards the optical element from a radiation source, the method comprising:

providing a second material comprising one or more elements selected from B, C, Si, Ge and/or Sn on the surface such that, in use, substantially more particles of the second material are emitted than particles of the first material.

2. A method according to claim 1, wherein the source of radiation is a plasma source comprising a Xe source of radiation, a Li source of radiation, or a Sn source of radiation.

3. A method according to claim 1, wherein at least part of the second material is removed by collision of particles from the source of radiation with the second material, irradiation of the second material, and/or transfer of thermal energy to the second material.

4. A method according to claim 1, wherein the second material is provided to at least part of a gas barrier in the lithographic apparatus.

5. A method according to claim 1, wherein the second material is provided to at least part of a support, an apparatus wall, a wall of a chamber of the source of radiation, and/or an edge of an aperture in the lithographic apparatus.

6. A method according to claim 1, wherein the second material is provided to at least part of an electrode of the source of radiation.

7. A method according to claim 1, wherein the second material is provided by wetting, coating and/or impregnating the surface.

8. A method according to claim 1, wherein the second material comprises a material that after deposition on the optical element can at least partially be removed from the optical element by atomic hydrogen, or a halogen, or a combination thereof.

9. A method according to claim 1, wherein the optical element is a mirror, a grating, a reticle and/or a sensor.

10. A method according to claim 1, wherein the optical element comprises a collector mirror.

11. A method according to claim 1, wherein, in use, the surface is subject to mechanical forces such that the particles are emitted towards the optical element.

12. A method according to claim 11, wherein the radiation source comprises the surface and, in use, the mechanical forces are generated by a high temperature of the radiation source.

13. A method according to claim 11, wherein a further contamination source is provided, which further contamination source, in use, emits particles towards the surface, the surface being disposed such that the particles from the further contamination source exert the mechanical forces.

14. A method for the protection of an optical element for a lithographic apparatus, the lithographic apparatus including a source of radiation, and one or more parts selected from the group comprising a gas barrier, a support, an apparatus wall, a wall of a chamber of the source of radiation, and an edge of an aperture, the method comprising:

operating the source of radiation to generate a plasma comprising Sn, so as to provide a Sn deposition on the one or more parts; and operating the source of radiation to generate a plasma comprising Sn, so as to provide a Sn deposition to an optical element of the lithographic apparatus, wherein at least part of Sn deposition on the one or more parts is removed by collision with particles from the source of radiation during the operation of the source of radiation to generate a plasma comprising Sn, so as to provide the Sn deposition to the optical element.

15. A method according to claim 14, wherein the optical element comprises a mirror, a grating, a reticle and/or a sensor.

16. A method according to claim 14, wherein the optical element comprises a collector mirror.

17. A device manufacturing method through use of a lithographic apparatus having an optical element and a radiation source, the apparatus including a material comprising one or more elements selected from a group comprising B, C, Si, Ge and/or Sn, the method comprising:
generating a radiation beam with radiation from the source of radiation;
patterning the radiation beam;
projecting the patterned radiation beam onto a target portion of a substrate; and
removing at least part of the material by operation of the source, wherein at least part of the removed material deposits on the optical element.

18. A method according to claim 17, wherein the source of radiation is a plasma source comprising a Xe source of radiation, a Li source of radiation, or a Sn source of radiation.

19. A method according to claim 17, wherein at least part of the material is removed by collision of particles from the source of radiation with the material, irradiation of the material and/or transfer of thermal energy to the material.

20. A method according to claim 17, wherein the material is provided to a gas barrier in the lithographic apparatus.

21. A method according to claim 17, wherein the material is provided to a support, an apparatus wall, a wall of a chamber of the source of radiation, and/or an edge of an aperture in the lithographic apparatus.

22. A method according to claim 17, wherein the material is provided to an electrode of the source of radiation.

23. A method according to claim 17, wherein the material is provided by wetting, coating and/or impregnating.

24. A method according to claim 17, wherein the material comprises a material that after deposition on the optical element can at least partially be removed from the optical element by atomic hydrogen or a halogen.

25. A method according to claim 17, wherein the optical element comprises a mirror, a grating, a reticle, and/or a sensor.

26. A method according to claim 17, wherein the optical element comprises a collector mirror.

27. A method according to claim 17, wherein the at least part of the material is subjected to mechanical forces such that the removed material is emitted towards the optical element.

28. A method according to claim 27, wherein the radiation source comprises the material and the mechanical forces are generated by a high temperature of the radiation source.

29. A method according to claim 27, wherein further material is provided, which further material emits particles towards the first material, the first material disposed such that the particles from the further material exert the mechanical forces.

30. A lithographic apparatus comprising:
an illumination system configured to condition a radiation beam;
a support configured to support a patterning device, the patterning device configured to impart the radiation beam with a pattern in its cross-section to form a patterned radiation beam;
a substrate table configured to hold a substrate;
a projection system configured to project the patterned radiation beam onto a target portion of the substrate; an optical element;
a source of radiation;
one or more parts of the lithographic apparatus selected from a group comprising i) a gas barrier, ii) the support, iii) an apparatus wall, iv) a wall of a chamber of the source of radiation, v) an electrode, and vi) an edge of an aperture, having a deposition comprising one or more elements selected from B, C, Si, Ge and/or Sn, wherein the deposition has a layer thickness of 5–200 µm.

31. A lithographic apparatus according to claim 30, wherein the optical element comprises a mirror, a grating, a reticle and/or a sensor.

32. A lithographic apparatus according to claim 30, wherein the optical element comprises a collector mirror.

* * * * *